(12) United States Patent
Gupta et al.

(10) Patent No.: US 10,910,705 B2
(45) Date of Patent: Feb. 2, 2021

(54) ANTENNA IN PACKAGE DEVICE HAVING SUBSTRATE STACK

(71) Applicant: Texas Instruments Incorporated, Dallas, TX (US)

(72) Inventors: Vikas Gupta, Dallas, TX (US); Athena Lin, Dallas, TX (US); Juan Alejandro Herbsommer, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 43 days.

(21) Appl. No.: 16/447,419

(22) Filed: Jun. 20, 2019

(65) Prior Publication Data

US 2020/0403299 A1 Dec. 24, 2020

(51) Int. Cl.
| | |
|---|---|
| *H01Q 1/38* | (2006.01) |
| *H01L 23/66* | (2006.01) |
| *H01L 23/31* | (2006.01) |
| *H01L 23/00* | (2006.01) |
| *H01L 23/538* | (2006.01) |
| *H01L 25/16* | (2006.01) |
| *H01L 23/498* | (2006.01) |
| *H01L 21/48* | (2006.01) |
| *H01L 23/14* | (2006.01) |
| *H01L 23/15* | (2006.01) |
| *H01L 21/56* | (2006.01) |
| *H01Q 1/22* | (2006.01) |
| *H04B 1/40* | (2015.01) |
| *H01Q 1/24* | (2006.01) |

(52) U.S. Cl.
CPC ............ *H01Q 1/38* (2013.01); *H01L 21/4853* (2013.01); *H01L 21/565* (2013.01); *H01L 23/145* (2013.01); *H01L 23/15* (2013.01); *H01L 23/3128* (2013.01); *H01L 23/49816* (2013.01); *H01L 23/49833* (2013.01); *H01L 23/5389* (2013.01); *H01L 23/66* (2013.01); *H01L 24/16* (2013.01); *H01L 24/81* (2013.01); *H01L 25/162* (2013.01); *H01Q 1/2283* (2013.01); *H01Q 1/24* (2013.01); *H04B 1/40* (2013.01); *H01L 23/49827* (2013.01); *H01L 23/5384* (2013.01); *H01L 2223/6616* (2013.01); *H01L 2223/6627* (2013.01); *H01L 2223/6677* (2013.01); *H01L 2224/16227* (2013.01); *H01L 2224/81203* (2013.01); *H01L 2924/19033* (2013.01)

(58) Field of Classification Search
CPC ............................... H01G 1/24; H01G 1/2283
See application file for complete search history.

(56) References Cited

U.S. PATENT DOCUMENTS 8,178,457 B2  5/2012 de Rochemont

*Primary Examiner* — Graham P Smith
(74) *Attorney, Agent, or Firm* — Ronald O. Neerings; Charles A. Brill; Frank D. Cimino

(57) ABSTRACT

An antenna-in-package (AiP) device includes a substrate stack having a ceramic substrate attached to an organic substrate, where a dielectric constant of the ceramic substrate is higher than a dielectric constant of the organic substrate. An antenna is on a top side of the ceramic substrate. An integrated circuit (IC) die is flip chip attached to a bottom side of the ceramic substrate or to a top surface of the organic substrate. The IC die includes a radio circuit including at least a transmitter, and there is at least one interconnect for coupling the radio circuit to the antenna.

20 Claims, 6 Drawing Sheets

ANTENNA IN PACKAGE DEVICE HAVING SUBSTRATE STACK

FIELD

This Disclosure relates to packaged semiconductor devices having integrated antennas.

BACKGROUND

The millimeter-wave (mmWave) frequency spectrum is generally defined to be 30 gigahertz (GHz) to 300 GHz, which corresponds to wavelengths from 10 mm to 1 mm. A number of communications applications such as uncompressed high definition video streaming, mobile distributed computing, wireless gaming, Internet access, and high data rate large file transfer can all be supported by communications using the mmWave frequency spectrum, such as using 60 GHz to 80 GHz radios. Typical antenna types for mmWave radio systems comprise reflector, lens, patch, dipole, slot, Vivaldi, dielectric resonator, and horn antennas.

An antenna-in-package (AiP) mmWave device combines an antenna (or antennas) with an integrated circuit (IC) radio die into a standard surface mounted chipscale package device, which miniaturizes the wireless system. The interconnection between the IC radio die and the antenna in the AiP device needs to provide a low return loss and low insertion loss over the signal frequency range. AiP is recognized as having a useful antenna arrangement for highly integrated mmWave radios for high-speed short-range wireless communications because of the relatively high gain and broad bandwidth generally provided.

Known AiP devices include several different configurations. At the package interface with the antenna, a high dielectric constant substrate such as a ceramic substrate typically being aluminum oxide ($Al_2O_3$) that has a relative dielectric constant ($εr$) of about 9.8, is helpful for enhancing antenna performance. Conventional packaging substrates comprise organic material layers (e.g., FR4 which is a composite material comprising woven fiberglass cloth with an epoxy resin binder that is flame resistant (self-extinguishing)) are popular because of their cost benefits, although they have more limited dielectric properties. Also, although ceramic substrates have higher $εr$ values as compared to organic substrates which may have a typical $εr$ value of about 3, they are more expensive. Ceramic substrates also generally provide better reliability as compared to organic substrates.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects solve performances problem for AiP devices. For example, there are performance requirements in high frequency (60 GHz to 80 GHz) communication applications, where it is generally difficult to achieve good device performance and cost efficiency with known AiP devices. In particular, efficient integrated antennas operating at mm-wave frequencies generally need a metallic reflector positioned away from the antenna at a distance $λ/4$, where $λ$ is the wavelength. MmWave (also called millimeter band) is the band of spectrum between 30 GHz and 300 GHz.

At frequencies 60 GHz to 80 GHz the $λ$ is around 5 mm in air and 3 mm in a dielectric material that has a typical $εr=3$. As a result, if one wants to provide an integrated antenna using the top metal layer of a typical multi-layer organic substrate that has an $εr=3$, the metallic layer reflector generally needs to be on the bottom metal layer of the organic substrate that is about 3 mm thick, which is too thick to implement in most applications. In addition, the lateral (x,y) dimensions of the antenna generally scale with the square root of $εr$, so that a lower dielectric constant organic substrate results in an increase in the lateral dimensions of the antenna, thus increasing of the overall area of the antenna.

Disclosed aspects include an AiP device comprising a substrate stack that enables high performance for AiP. The substrate stack comprise a ceramic substrate attached to an organic substrate, where the dielectric constant of the ceramic substrate is higher as compared to a dielectric constant of the organic substrate. An antenna is on a top side of the ceramic substrate. An IC die is positioned between the ceramic substrate and the organic substrate. A mold compound fills the gap between the ceramic substrate and the organic substrate. The IC die includes a radio circuit including at least a transmitter, and the ceramic substrate includes at least one interconnect (e.g., a copper filled through-via) for coupling the radio circuit to the antenna.

BRIEF DESCRIPTION OF THE DRAWINGS

Reference will now be made to the accompanying drawings, which are not necessarily drawn to scale, wherein:

FIG. 2A shows a ceramic substrate having a patterned metal layer including antenna and a patterned metal layer including a metal reflector and metal pads with a non-conductive paste dispensed on the metal layer lateral to the metal reflector with results being shown in FIG. 2B.

FIG. 2C shows the IC die including solder capped pillars on the bond pads being thermo-compression flip chip attached to the metal pads on the ceramic substrate through the non-conductive paste. FIG. 2D shows an organic substrate having metal pads its top surface and FIG. 2E shows in-process result after metal balls are formed on the metal pads. FIG. 2F shows the in-process AiP device after thermo-compression bonding of the ceramic substrate to the organic substrate, and FIG. 2G shows the in-process AiP device following molding to fill a gap between the substrates, followed by forming metal balls on the metal pads on the bottom side of the organic substrate with the result shown in FIG. 2H.

FIG. 3A shows the result after dispensing a nonconductive paste on metal pads on an organic substrate, and FIG. 3B shows the step of thermo-compression flip chip attaching an IC die so that the solder capped pillars on the bond pads of the IC die are attached to the metal pads on the organic substrate.

FIG. 3C shows a ceramic substrate provided with an antenna on one side and a metal reflector on the other, while FIG. 3D shows the ceramic substrate after forming balls on metal pads. FIG. 3E shows the in-process AiP device after thermo-compression bonding of the two substrates. FIG. 3F shows the in-process AiP device after molding to form a mold compound that fills a gap between the substrates, and FIG. 3G shows the AiP device after forming a ball grid array (BGA) on a bottom side of the AiP device.

DETAILED DESCRIPTION

Figure 1A:
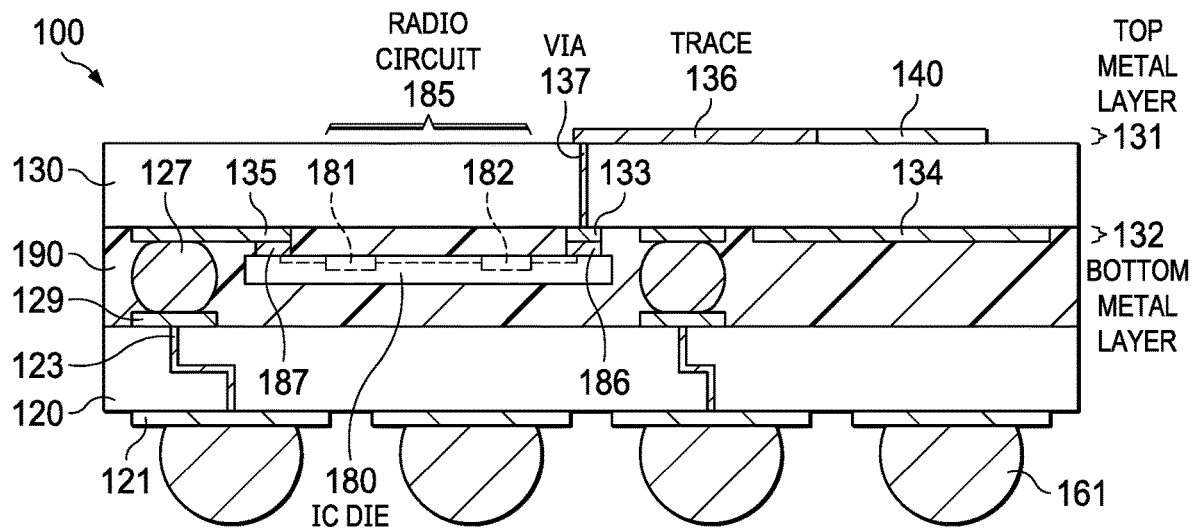
FIG. 1A shows a cross-sectional depiction of an example AiP device comprising an integrated antenna on a ceramic substrate attached to an organic substrate, with the IC die including a radio circuit comprising at least a transmitter that is coupled to the antenna, where the IC die is flip chip attached to a bottom side of the ceramic substrate, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

The high dielectric constant of a ceramic substrate of a disclosed substrate stack enables higher antenna performance (e.g., 13 GHz of bandwidth and 7 dBi of gain for a dielectric resonator antenna operating at 60 GHz) as compared to antenna performance using conventional organic substrates. As known in the art of antennas, when one calculates the gain of an antenna and compares it to an isotropic antenna the unit of the gain is dBi, where the 'i' stands for an isotropic antenna that by definition has a 0 dB power rating.

Substrate materials with high dielectric constant such as aluminum oxide can miniaturize the antenna size without degrading its performance, which is useful for applications needing small device form factors. Disclosed AiP devices can be offered at a lower cost as compared to AiP devices formed on typical ceramic substrates due to the lower cost organic substrate portion. Thus, disclosed AiP devices having ceramic/organic substrate stacks enable a cost competitive, high performance AiP device. The ceramic substrate with its relatively high dielectric constant improves the antenna performance, while the organic substrate provides cost advantages relative to ceramic substrates.

As used herein a ceramic material takes on its ordinary material science definition being an inorganic, non-metallic, often crystalline oxide, nitride or carbide material. The ceramic material generally withstands chemical erosion that occurs in other materials subjected to acidic or caustic environments, and the ceramic materials generally can withstand very high temperatures typically up to 1,000° C. to 1,600° C. As noted above one example ceramic material used for package substrates is aluminum oxide also known as alumina. An alumina substrate may include an organic binder and a plasticizer that are added to assist in its fabrication.

FIG. 1A shows a cross-sectional depiction of an example AiP device 100 comprising an antenna 140 on a ceramic substrate 130 that is attached to an organic substrate 120 bonded below. A dielectric constant material of the ceramic substrate 130 is higher as compared to the dielectric constant of the organic substrate 120. The IC die 180 is flip chip attached to a bottom side of the ceramic substrate 130. The dielectric constant of the ceramic substrate 130 can be at least 3 times a dielectric constant of the organic substrate 120.

The IC die 180 includes at least a transmitter 182 coupled to the antenna 140. The ceramic substrate 130 includes a patterned metal layer 131 on one side of the ceramic substrate 130 and a patterned metal layer 132 on the opposite side of the ceramic substrate 130. The metal layer 131 comprises metal traces including a trace 136 that is coupled to an antenna 140. The metal layer 132 includes a metal pad 133 that is coupled to the trace 136 by a metal (e.g., copper) filled through-hole via (through-via) 137, and a metallic reflector 134 is below the antenna 140.

The interconnect path beside the via 137 may also include a coplanar waveguide (CPW) portion, and the trace 136 may comprise a microstrip between the IC die 180 and the antenna 140 that generally provides an impedance that matches an interconnect impedance to an impedance of the antenna for a maximum power transfer. As known in antenna theory, if the antenna is impedance matched to its feeding transmission line, then the input impedance of the transmission line does not depend on the length of the transmission line. A commonly used design rule is that the impedance matching is considered good when the return loss is lower than −10 dB in the band of operation.

The metal reflector 134 is not always needed, such as when the antenna 140 comprises a dielectric resonator antenna. The ceramic substrate 130 is generally 300 μm to 800 μm thick to provide a λ/4 spacing between the antenna 140 and the metal reflector 134. The organic substrate 120 is generally 600 μm to 1,000 μm (1 mm) thick, so that in a typical embodiment the organic substrate 120 is thicker as compared to a thickness of the ceramic substrate 130.

The IC die 180 includes a radio circuit 185 that comprises at least frequency synthesizing and driving circuitry 181 that is coupled to transmit circuitry 182. The radio circuit 185 generally also includes receive circuitry so that a transceiver is provided. An output of the transmit circuitry 182 (and receive circuitry if provided) is coupled to a bond pad 186 on the IC die 180 that generally has a bonding feature thereon such as solder capped copper pillar that is connected to the metal pad 133 on the bottom surface of the ceramic substrate 130. An input to the frequency synthesizing and driving circuitry 181 is coupled to a bond pad 187 on the IC die 180 that generally has a bonding feature thereon such as solder capped copper pillar that is connected to the metal pad 135 on the bottom surface of the ceramic substrate 130 that is coupled to a bottom side of the organic substrate 120 by a metal ball 127 coupled to a metal pad 129 and then a through-via 123.

The organic substrate 120 includes a patterned bottom metal layer including metal pads 121 that have solder balls 161 thereon which collectively provide a BGA which enables mounting the AiP device 100 to another substrate, such as to land pads on a printed circuit board (PCB). Pads other than metal pad 129 on the top metal layer of the organic substrate 120 are shown coupled to a metal layer 132 shown on the bottom of the ceramic substrate 130 by the metal balls 127. There is shown a mold compound 190 for filling the gap between the organic substrate 120 and the ceramic substrate 130.

Figure 1B:
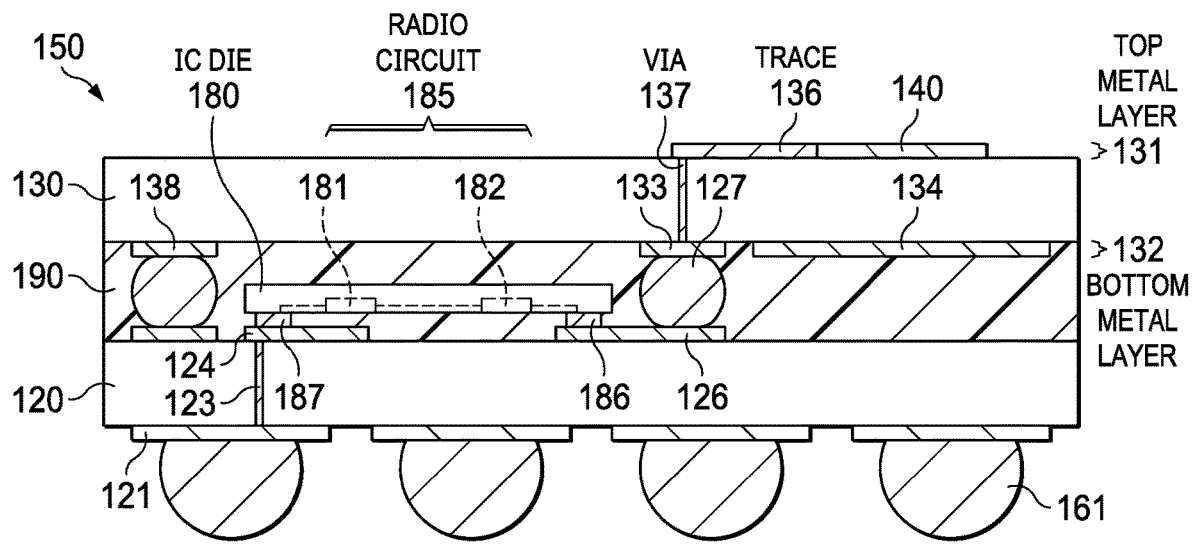
FIG. 1B shows a cross-sectional depiction of an example AiP device comprising an integrated antenna on a ceramic substrate attached to an organic substrate, where the IC die is flip chip attached to a top surface of the organic substrate, according to an example aspect.

FIG. 1B shows a cross-sectional depiction of an example AiP device 150 comprising an integrated antenna 140 on a ceramic substrate 130 attached to an organic substrate 120. The IC die 180 is shown flip chip attached to a top surface (e.g., metal pads on a top metal layer) of the organic substrate 120. The organic substrate 120 has metal pads 124 and 126 on its top surface.

Figure 1C:
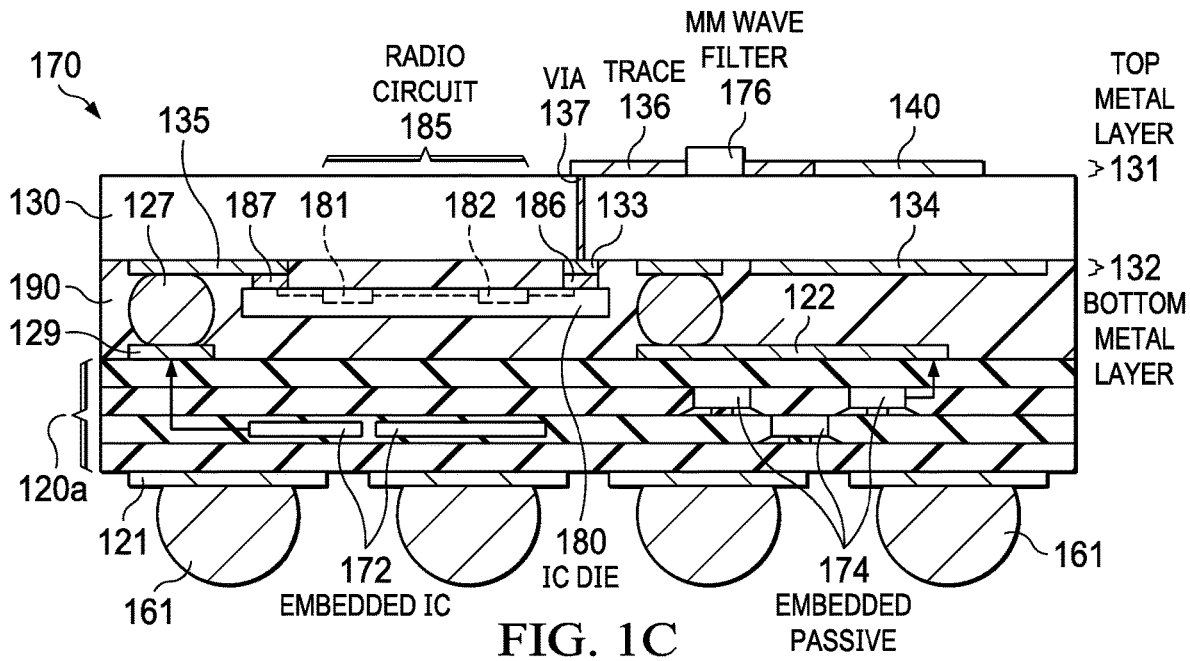
FIG. 1C shows a cross-sectional depiction of an example AiP device comprising an integrated antenna on a ceramic substrate attached to a multi-level organic substrate, where the multi-level organic substrate is shown including at least one embedded IC and at least one embedded passive device, according to an example aspect.

FIG. 1C shows a cross-sectional depiction of an example AiP device 170 comprising an integrated antenna 140 on a ceramic substrate 130 attached to a multi-level organic substrate shown as 120a. The IC die 180 as in FIG. 1A is flip chip attached to a bottom side of the ceramic substrate 130. The AiP device 170 is shown including the multi-level organic substrate 120a having at least one embedded IC 172 and at least one embedded passive device 174.

One of the embedded ICs 172 is shown coupled to a metal pad 129 on the top side of the multi-level organic substrate 120a that couples to the bond pad 187 on the IC die 180, and one of the embedded passives 174 is also shown coupled to metal pad 122 on the top side of the multi-level organic substrate 120a. The embedded IC 172 can comprise a low frequency circuit such as a power management circuit including a DC-DC converter or a voltage regulator, low frequency clocking circuit, or a logic circuit. The embedded passive device 174 can comprise a capacitor, an inductor, or a resistor. There is also shown a mmWave filter 176 located on the top surface of the ceramic substrate 130 coupled to the antenna 140, that more generally can be positioned before or after the antenna 140.

Figure 2A:
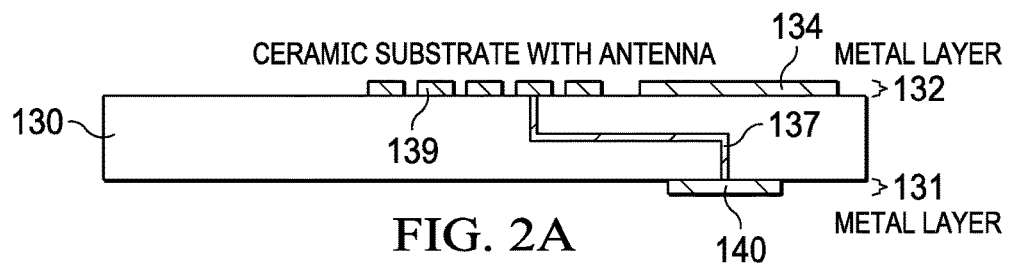
FIGS. 2A-2H show example steps for an assembly flow for forming a disclosed AiP device having an integrated antenna on a ceramic substrate attached to an organic substrate, where the IC die is flip chip attached to the ceramic substrate before the bonding together of the two substrates, according to an example aspect.

FIGS. 2A-2H show example steps for an assembly flow for forming a disclosed AiP device, such as the AiP device 100 shown in FIG. 1A, having an integrated antenna 140 on the ceramic substrate 130 attached to an organic substrate 120, where the IC die 180 is flip chip attached to a bottom side of the ceramic substrate 130. The IC die 180 is shown attached to the ceramic substrate 130 before the bonding together of the respective substrates 130/120. In FIG. 2A the ceramic substrate 130 is provided with a patterned metal layer 131 including antenna 140 and a patterned metal layer 132 including metal reflector 134 and metal pads 139.

Figure 2B:
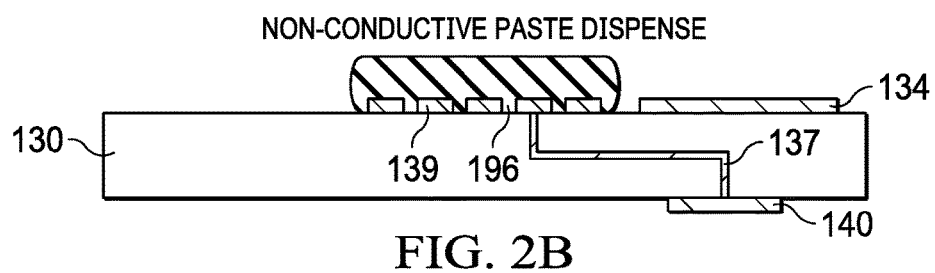
Figure 2C:
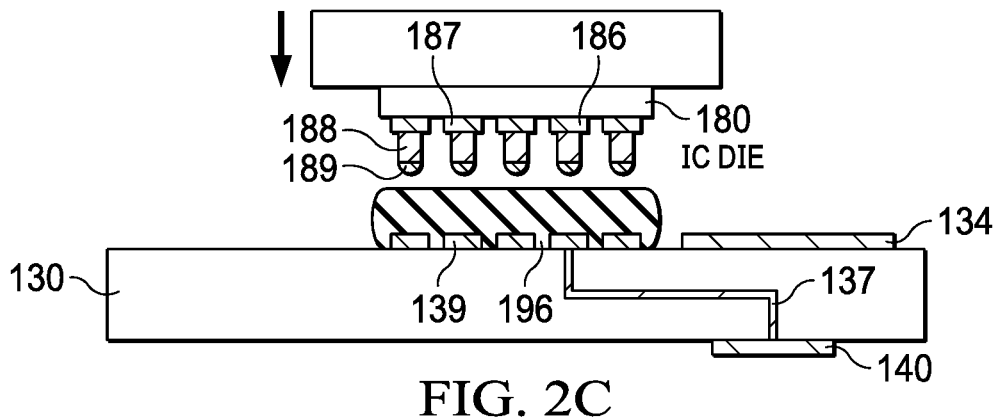

A non-conductive paste 196 that generally comprises an underfill material functioning as a die attachment is dispensed on the metal layer 132 lateral to the metal reflector 134 with the results shown in FIG. 2B. There are other forms of underfill dispense that also can be used, such as capillary underfill. As with the AiP device 100 shown in FIG. 1A, the metal layer 131 includes an antenna 140. As shown in FIG. 2C, the IC die 180 including solder 189 as caps on the metal pillars 188 on the bond pads 186 and 187 is thermo-compression flip chip attached to the metal pads 139 on the ceramic substrate 130 through the non-conductive paste 196. As known in the art of semiconductor device assembly, thermo-compression bonding is the most common method of flip chip attach with copper pillar interconnects. However other suitable bonding techniques may also be used.

Thermo-compression bonding is known to be a bonding technique generally useful for wafer to wafer bonding, not for bonding involving at least one package substrate bonding as disclosed herein, where thermo-compression bonding is also referred to as diffusion bonding, pressure joining, thermo-compression welding or solid-state welding. In thermo-compression bonding, two metals, are brought into atomic contact applying force and heat simultaneously. The diffusion generally needs atomic contact between the surfaces due to the atomic motion. The atoms migrate from one crystal lattice to the other one based on crystal lattice vibration. This atomic interaction sticks the interface together. The thermo-compression bonding with Al or Cu surfaces generally involves temperatures $\geq 400°$ C. to ensure sufficient hermetical sealing.

Figure 2D:
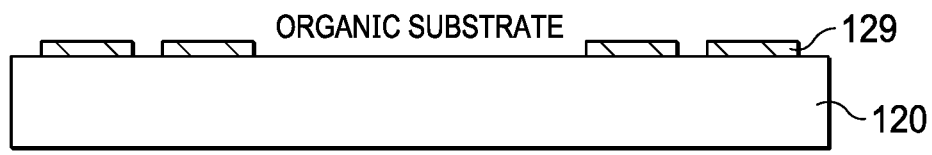
Figure 2E:
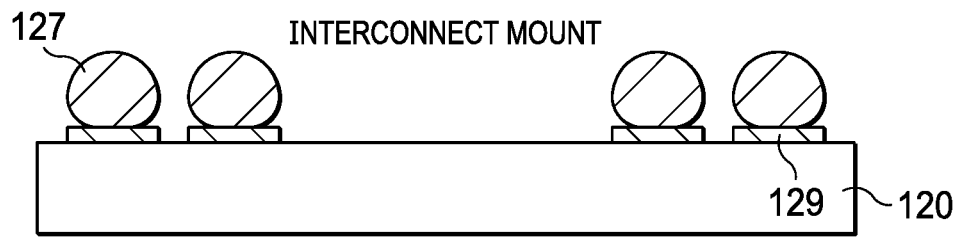
Figure 2F:
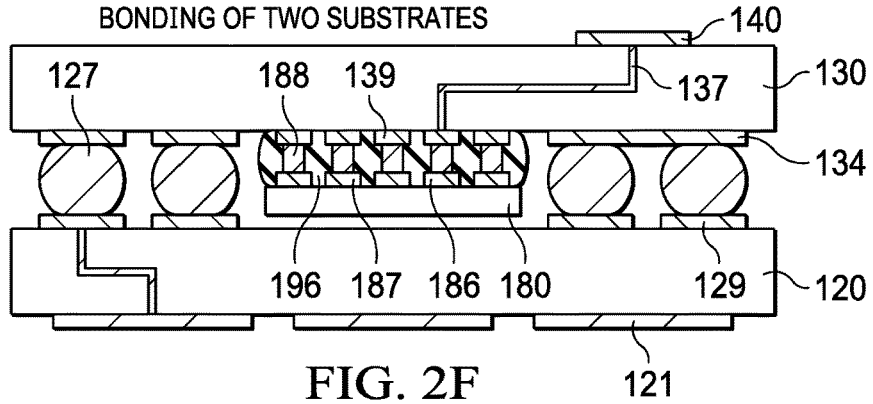
Figure 2G:
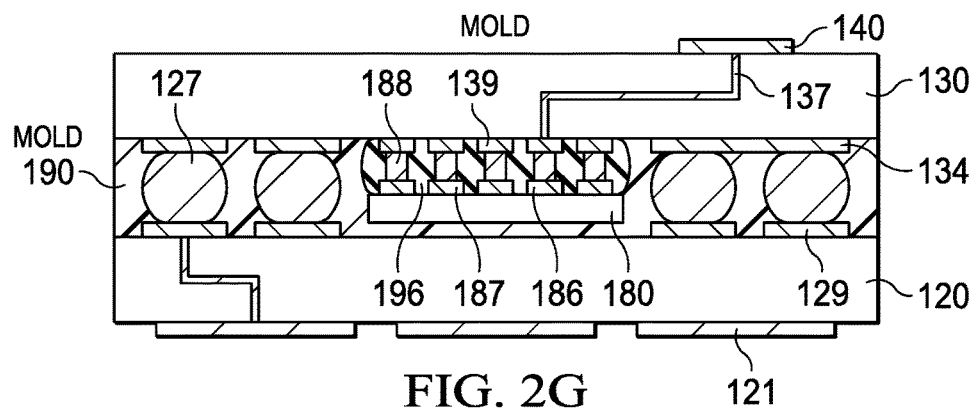
Figure 2H:
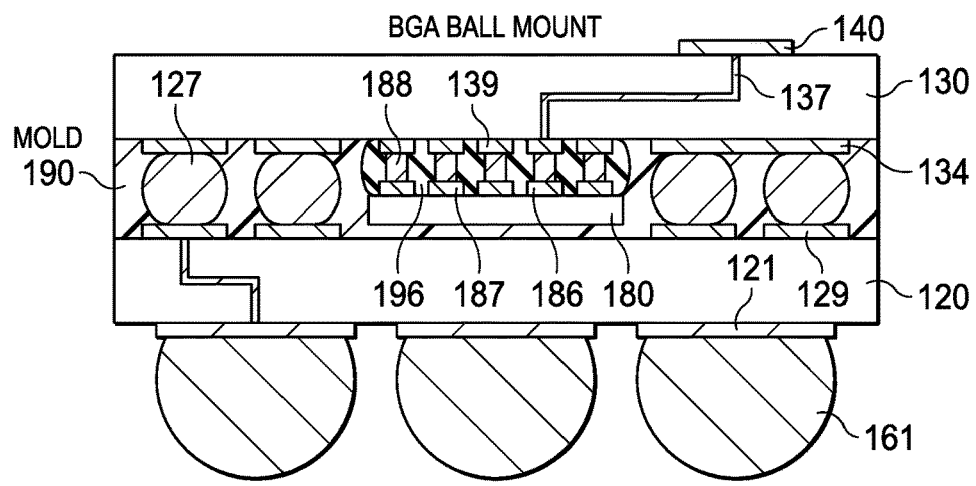

In FIG. 2D an organic substrate 120 is shown provided with metal pads 129 its top surface. FIG. 2E shows in-process result after metal balls 127 are formed on the metal pads 129. The metal balls 127 in one specific arrangement can be nickel plated copper balls. FIG. 2F shows in-the process AiP device after thermo-compression bonding of the ceramic substrate 130 to the organic substrate 120, and FIG. 2G shows the in-process AiP device following molding to form a mold compound 190 that fills a gap between the substrates, followed by forming metal balls 161 on the metal pads 121 on the bottom side of the organic substrate 120 with the result shown in FIG. 2H. Although suggested by the views shown in FIG. 2H, the metal balls 127 are not electrically connected to the metal reflector 134.

Figure 3A:
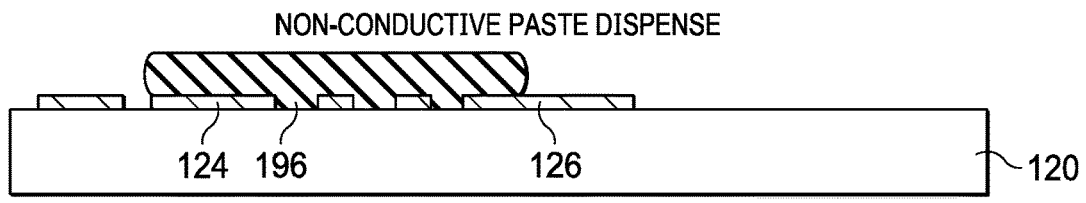
FIGS. 3A-3G show example steps for an assembly flow for forming a disclosed AiP device having an integrated antenna on the ceramic substrate attached to an organic substrate, where the IC die is flip chip attached to the organic substrate before the bonding together of the two substrates, according to an example aspect.
Figure 3B:
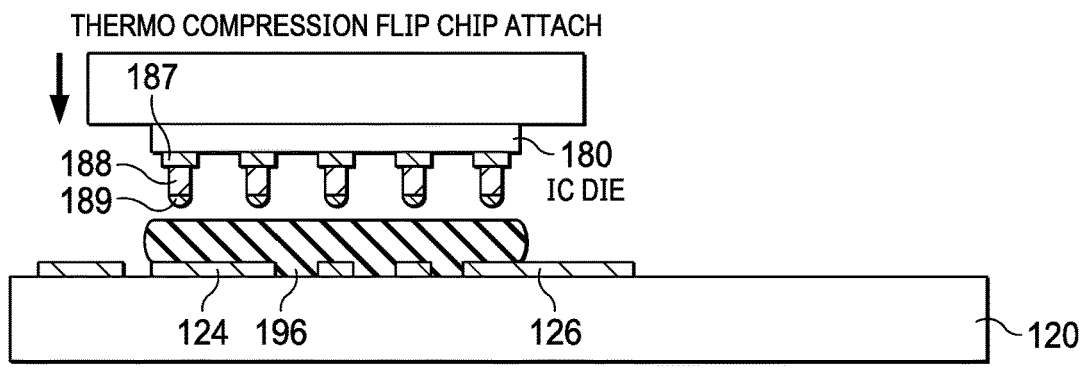

FIGS. 3A-3G show example steps for an assembly flow for forming a disclosed AiP device, similar to the AiP device 150 shown in FIG. 1B, having an integrated antenna 140 on the ceramic substrate 130 attached to an organic substrate 120, where the IC die 180 is flip chip attached to a top surface of the organic substrate 120. FIG. 3A shows a result after dispensing a non-conductive paste 196 on metal pads 124, 126 on an organic substrate 120. FIG. 3B shows the step of thermo-compression flip chip attaching an IC die 180 so that the solder capped pillars 189/188 on the bond pads 187 of the IC die 180 attached to the metal pads 124, 126. The IC die 180 is thus attached to the organic substrate 120 before the bonding of the two substrates (the ceramic substrate 130 and the organic substrate 120).

Figure 3C:
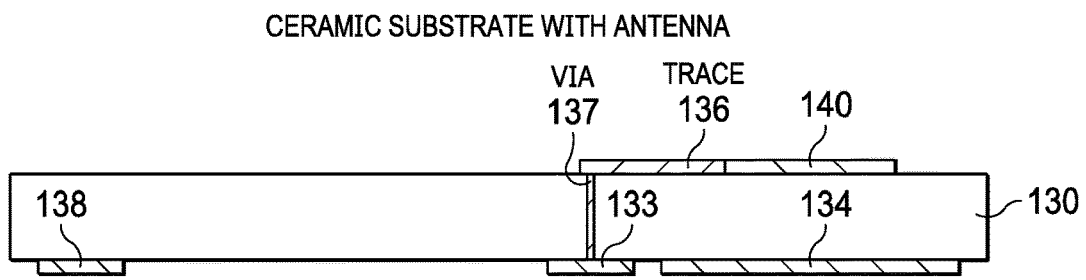
Figure 3D:
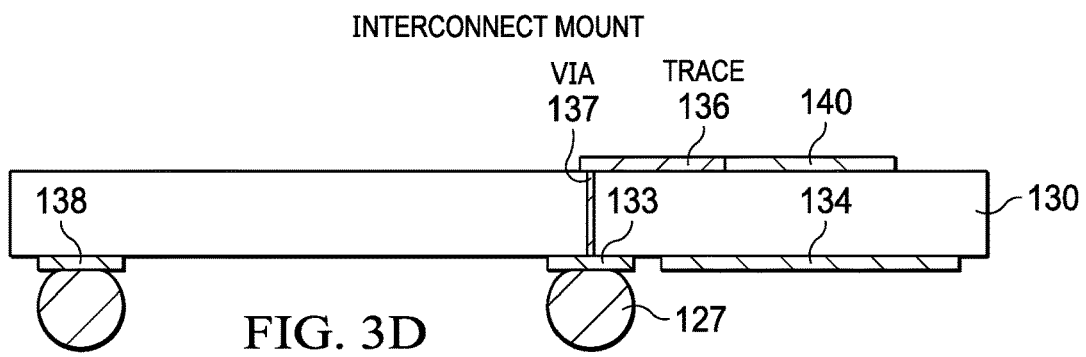
Figure 3E:
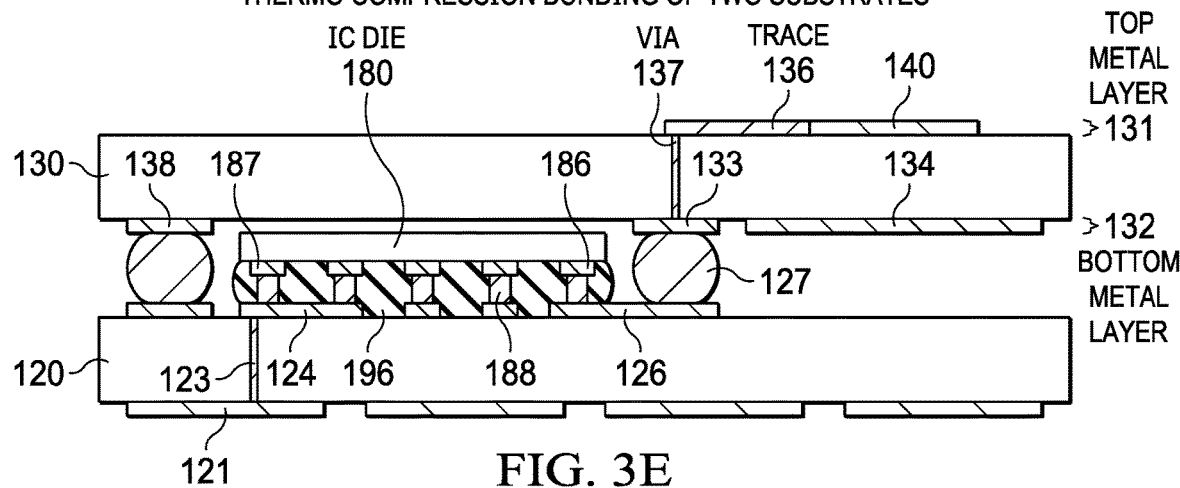
Figure 3F:
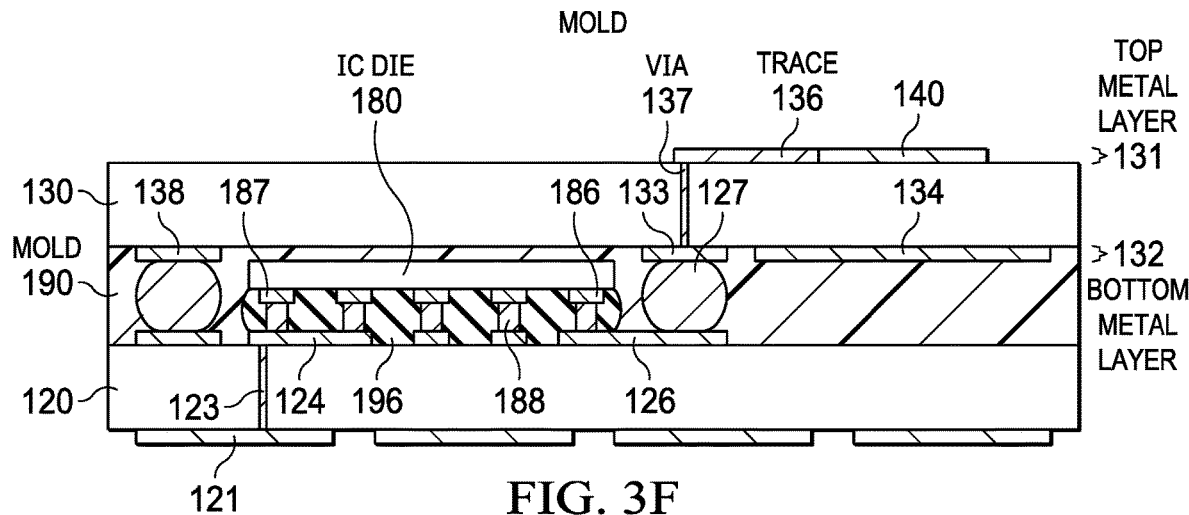
Figure 3G:
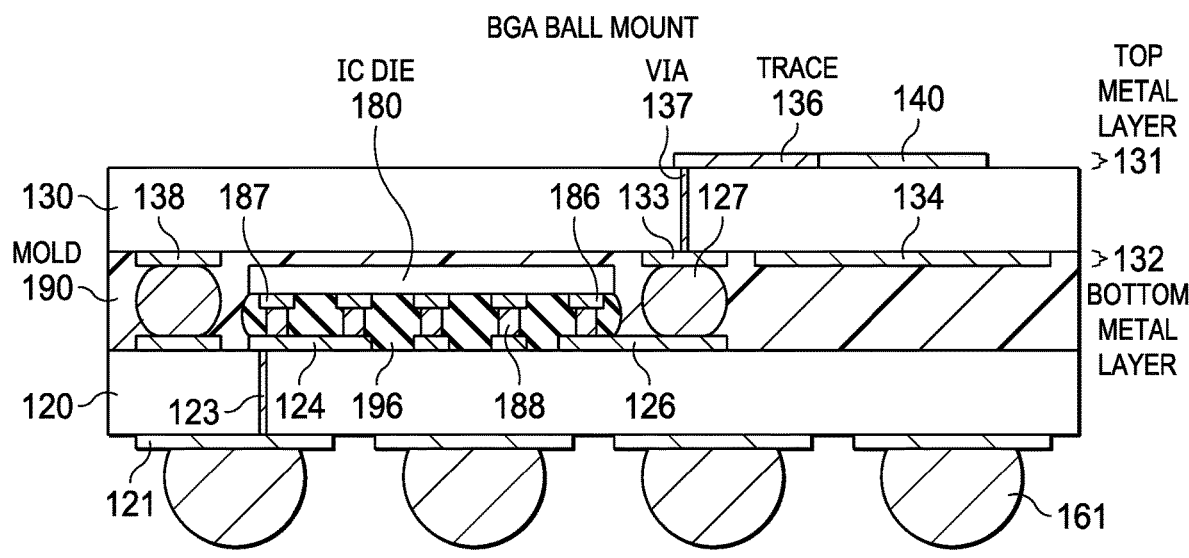

FIG. 3C shows a ceramic substrate 130 provided with an antenna 140 on one side and a metal reflector 134 on the other. FIG. 3D shows the ceramic substrate 130 after forming balls 127 on the metal pads 133, 138. FIG. 3E shows the in-process AiP device after thermo-compression bonding of the two substrates 120 and 130. FIG. 3F shows the in-process AiP device after molding to form a mold compound 190 that fills a gap between the substrates 120 and 130. FIG. 3G shows the AiP device after forming a BGA 161 on a bottom side of the AiP device.

Advantages of disclosed AiP devices include the antenna 140 being on a ceramic substrate 130 having an εr of about 10, enables miniaturization of the antenna 140 as compared to when using a conventional organic substrate, without degrading performance. This also allows the placement of reflectors such as the metal reflector 134 on the backside of a relatively thin ceramic substrate 130 needed by most antenna types as compared to the thickness needed for λ/4 if one were to use a conventional organic substrate.

Moreover, attaching the IC die 180 to a ceramic substrate 130 having a relatively high dielectric constant provides better coefficient of thermal expansion (CTE) matching between the semiconductor substrate of the IC die 180 (which generally comprises silicon) and the ceramic substrate 130. The organic substrate 120 lowers the package cost and has good coefficient of thermal expansion (CTE) match with a PCB. Also, low frequency circuits and passive devices such as resistors capacitors and inductors can be implemented in lower metal layer(s) of a multi-level organic substrate 120a, such as shown in FIG. 1C described above.

Disclosed aspects can be integrated into a variety of assembly flows to form a variety of different AiP devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. An antenna-in-package (AiP) device, comprising:
   a substrate stack comprising a ceramic substrate attached to an organic substrate, wherein a dielectric constant of the ceramic substrate is higher as compared to a dielectric constant of the organic substrate;
   an antenna on a top side of the ceramic substrate, and integrated circuit (IC) die positioned between the ceramic substrate and the organic substrate,
   a mold compound that fills a gap between the ceramic substrate and the organic substrate,
   wherein the IC die includes a radio circuit comprising at least a transmitter and the ceramic substrate includes at least one interconnect for coupling the radio circuit to the antenna.

2. The AiP device of claim 1, wherein the IC die is flip chip attached to a bottom side of the ceramic substrate.

3. The AiP device of claim 1, wherein the IC die is flip chip attached to a top surface of the organic substrate.

4. The AiP device of claim 1, wherein the organic substrate comprises a multi-level organic substrate, wherein the multi-level organic substrate further comprises at least one embedded IC or an embedded passive circuit.

5. The AiP device of claim 1, wherein the organic substrate is thicker as compared to a thickness of the ceramic substrate.

6. The AiP device of claim 1, wherein the dielectric constant of the ceramic substrate is at least 3 times higher as compared to the dielectric constant of the organic substrate.

7. The AiP device of claim 1, wherein the transmitter comprises a transceiver.

8. The AiP device of claim 1, further comprising a ball grid array (BGA) on a bottom side of the AiP device.

9. The AiP device of claim 1, further comprising a metal reflector on an opposite side of the ceramic substrate below the antenna.

10. The AiP device of claim 1, further comprising a millimeter-wave filter coupled to the antenna.

11. A method forming an antenna-in-package (AiP) device, comprising:
    providing a ceramic substrate with a top side having an antenna disposed thereon attached to an organic substrate, wherein a dielectric constant of the ceramic substrate is higher as compared to a dielectric constant of the organic substrate, with one of the ceramic substrate and the organic substrate having metal balls thereon, wherein the ceramic substrate includes at least one interconnect for coupling a radio circuit to the antenna;
    flip chip die attaching an integrated circuit (IC) die having the radio circuit comprising at least a transmitter to another of the ceramic substrate and the organic substrate;
    thermal compression bonding the organic substrate to the ceramic substrate so that the metal balls attach the ceramic substrate to the organic substrate, and
    molding to form a mold compound that fills a gap between the ceramic substrate and the organic substrate.

12. The method of claim 11, wherein the flip chip die attaching comprises attaching the IC die to a bottom side of the ceramic substrate.

13. The method of claim 11, wherein the flip chip die attaching comprises attaching the IC die to a top side of the organic substrate.

14. The method of claim 11, further comprising forming a ball grid array (BGA) on a bottom side of the AiP device.

15. The method of claim 11, wherein the organic substrate comprises a multi-level organic substrate that further comprises at least one embedded IC or an embedded passive device.

16. The method of claim 11, wherein the organic substrate is thicker as compared to a thickness of the ceramic substrate.

17. The method of claim 11, wherein the dielectric constant of the ceramic is at least 3 times higher as compared to the dielectric constant of the organic substrate.

18. The method of claim 11, wherein the ceramic substrate further comprises a reflector on an opposite side of the ceramic substrate below the antenna.

19. The method of claim 11, wherein the ceramic substrate further comprises a millimeter-wave filter coupled to the antenna.

20. The method of claim 11, wherein the transmitter comprises a transceiver.

* * * * *